(12) United States Patent
Wong et al.

(10) Patent No.: US 7,400,269 B2
(45) Date of Patent: Jul. 15, 2008

(54) CODING ELEMENT WITH INTEGRATED LIMIT SWITCH

(75) Inventors: Weng Fei Wong, Penang (MY); Chee Foo Lum, Penang (MY)

(73) Assignee: Avago Technologies ECBU IP Pte Ltd, Singapore (SG)

(*) Notice: Subject to any disclaimer, the term of this patent is extended or adjusted under 35 U.S.C. 154(b) by 0 days.

(21) Appl. No.: 11/595,046

(22) Filed: Nov. 9, 2006

(65) Prior Publication Data

US 2008/0111062 A1 May 15, 2008

(51) Int. Cl.
*H03M 1/22* (2006.01)
(52) U.S. Cl. ............... 341/13; 341/1; 341/9; 341/11; 250/231.13; 250/231.14; 250/231.16
(58) Field of Classification Search ............ 341/11, 341/13; 250/231.13
See application file for complete search history.

(56) References Cited

U.S. PATENT DOCUMENTS

| | | | |
|---|---|---|---|
| 4,451,731 A | 5/1984 | Leonard | |
| 4,691,101 A | 9/1987 | Leonard | |
| 5,241,172 A | 8/1993 | Lugaresi | |
| 5,929,789 A * | 7/1999 | Barbehenn | 341/11 |
| 6,100,822 A * | 8/2000 | Liu | 341/9 |
| 6,320,185 B1 * | 11/2001 | Matsuo | 250/231.13 |
| 6,355,927 B1 * | 3/2002 | Snyder | 250/231.13 |
| 6,392,224 B1 * | 5/2002 | Holzapfel et al. | 250/231.13 |
| 6,797,940 B2 * | 9/2004 | Steegmueller et al. | 250/231.13 |
| 6,927,704 B1 * | 8/2005 | Rouleau | 341/13 |
| 7,026,604 B2 * | 4/2006 | Keong | 250/231.13 |
| 7,126,108 B2 * | 10/2006 | Hin et al. | 250/231.13 |
| 7,220,960 B2 * | 5/2007 | Ito | 250/231.13 |
| 2002/0180691 A1 | 12/2002 | Wong et al. | |
| 2005/0088667 A1 | 4/2005 | Yeo | |
| 2005/0133705 A1 | 6/2005 | Hare et al. | |
| 2005/0236560 A1 | 10/2005 | Ch'ng et al. | |
| 2006/0192764 A1 | 8/2006 | Siddiqui | |

* cited by examiner

*Primary Examiner*—Khai M Nguyen

(57) ABSTRACT

An optical encoder. The optical encoder includes a coding element, an emitter, and a detector. The coding element has a track with a track pattern. The track pattern includes a plurality of optically distinguishable sections. The plurality of optically distinguishable sections includes a limit switch section. The emitter generates a light signal incident on the track of the coding element. The detector includes a limit switch photodetector positioned to detect the light signal from the emitter. The detector generates a limit switch output signal in response to the detected light signal above a limit switch threshold at the limit switch photodetector. Embodiments of this type of optical encoder implement limit switches into a single track on the coding element.

20 Claims, 10 Drawing Sheets

CODING ELEMENT WITH INTEGRATED LIMIT SWITCH

BACKGROUND OF THE INVENTION

Optical encoders are used to monitor the motion of, for example, a shaft such as a crank shaft. Optical encoders can monitor the motion of a shaft in terms of position and/or number of revolutions of the shaft. Optical encoders typically use a code wheel attached to the shaft to modulate light as the shaft and the code wheel rotate. In a transmissive code wheel, the light is modulated as it passes through transmissive sections of a track on the code wheel. The transmissive sections are separated by non-transmissive sections. In a reflective code wheel, the light is modulated as it is reflected off of reflective sections of the track on the code wheel. The reflective sections are separated by non-reflective sections. As the light is modulated in response to the rotation of the code wheel, a stream of electrical signals is generated from a photodetector array that receives the modulated light. The electrical signals are used to determine the position and/or number of revolutions of the shaft.

In order to control the range of motion of the code wheel, some encoders use photointerruptors to detect when a part of the controlled device rotates to a predetermined boundary condition. The use of separate photodetectors typically requires additional hardware, and increases the size and cost of the encoder and control system.

Some conventional code wheels include multiple tracks such as separate position and index tracks. These separate tracks on the code wheel are used to determine the rotational position of the shaft, relative to a fixed rotational position, and to determine the number of revolutions of the shaft. In some implementations, it may be useful to limit the rotational movement of the shaft, depending on the type of device controlled by the motor. For example, it may be useful to control how far a mechanical door opens or to determine when the door is closed, so that the motor can be stopped at the right time.

One disadvantage to using separate position and index tracks is that the size of the code wheel may be larger than it would otherwise be if fewer tracks were implemented. The larger size of the code wheel can affect the type of devices in which the code wheel may be used, or the cost of the code wheel, or both. Additionally, the layout of the separate tracks on the code wheel and photodetectors can limit the resolution of the code wheel. Moreover, the task of precisely aligning the separate tracks with the corresponding photodetector arrays becomes more difficult as the number of tracks increases.

SUMMARY OF THE INVENTION

Embodiments of an optical encoder are described. The optical encoder includes a coding element, an emitter, and a detector. The coding element has a track with a track pattern. The track pattern includes a plurality of optically distinguishable sections. The plurality of optically distinguishable sections includes a limit switch section. The emitter generates a light signal incident on the track of the coding element. The detector includes a limit switch photodetector positioned to detect the light signal from the emitter. The detector generates a limit switch output signal in response to the detected light signal above a limit switch threshold at the limit switch photodetector. Embodiments of this type of optical encoder implement limit switches into a single track on the coding element. Other embodiments of the apparatus are also described.

In some embodiments, a system may include the optical encoder, a decoder, and a microprocessor. The encoder generates a periodic channel signal and a limit switch output signal. The decoder generates a count signal corresponding to the periodic channel signal, and generates a limit signal corresponding to the limit switch output signal. The microprocessor controls the movement of a moving part and alters the movement of the moving part in response to the limit signal from the decoder. Although the system may be implemented to control many types of moving parts, some implementations facilitate control of a focusing element in a camera or projector. Other types of moving parts such as motor shafts may be monitored and controlled.

Embodiments of a method for controlling a range of motion for a device are also described. In one embodiment, the method includes coupling a coding element to a moving part of the device, generating a light signal incident on the track of the coding element, detecting the light signal, and generating a limit switch output signal in response to the detected light signal above a limit switch threshold. In some embodiments, the coding element includes a track with a track pattern of a plurality of optically distinguishable sections. Other embodiments of the method are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1:
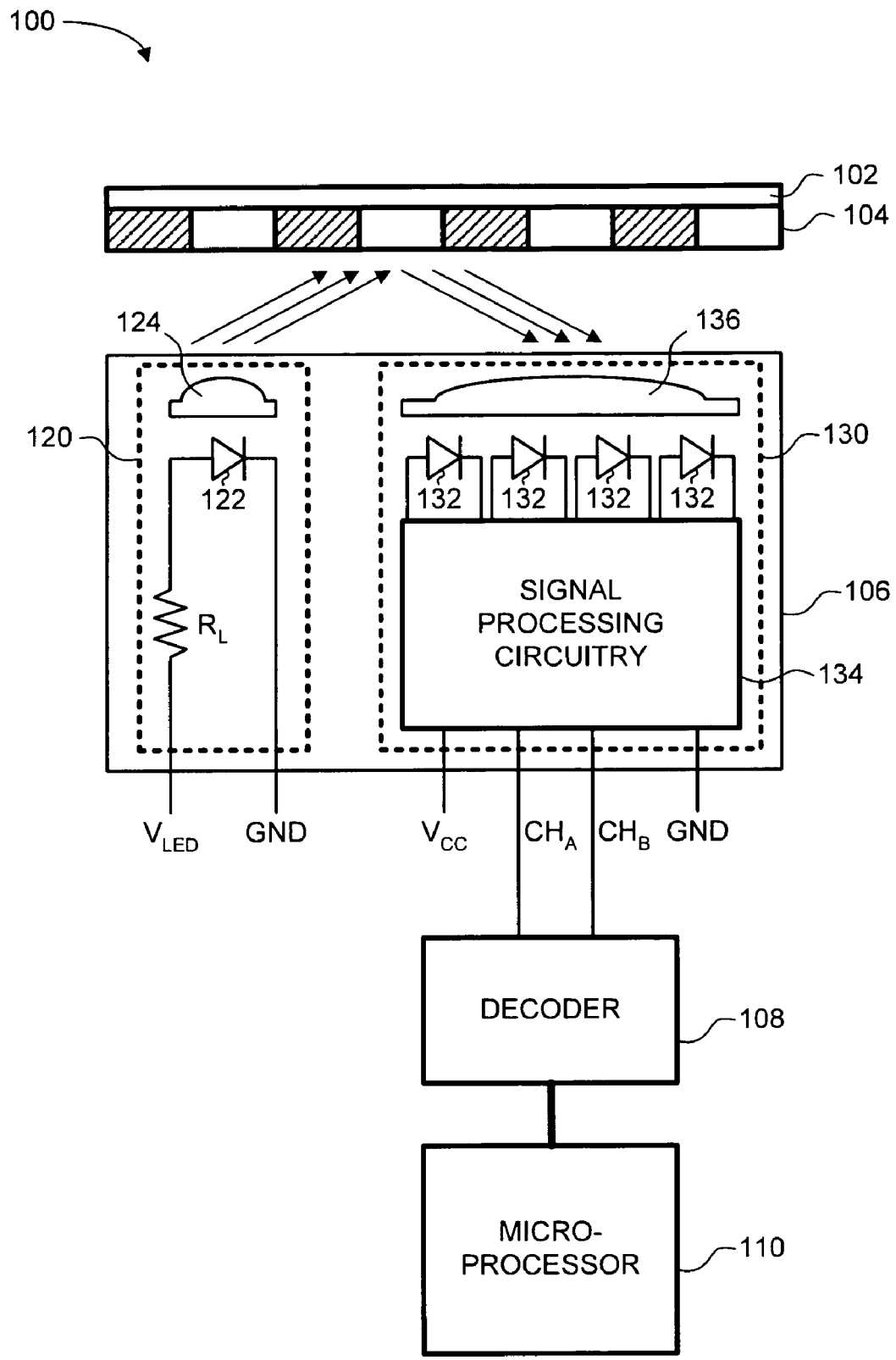
FIG. 1 depicts a schematic circuit diagram of one embodiment of a reflective optical encoding system.

FIG. 1 depicts a schematic circuit diagram of one embodiment of a reflective optical encoding system 100. The illustrated reflective optical encoding system 100 includes a reflective material 102, a code wheel 104, an encoder 106, a decoder 108, and a microprocessor 110. In one embodiment, the reflective material 102 is a coating or a substrate that is physically coupled to the code wheel 104. In some embodiments, the reflective surface of the reflective material 102 is coupled to the code wheel 104 opposite the encoder 106.

Figure 2:
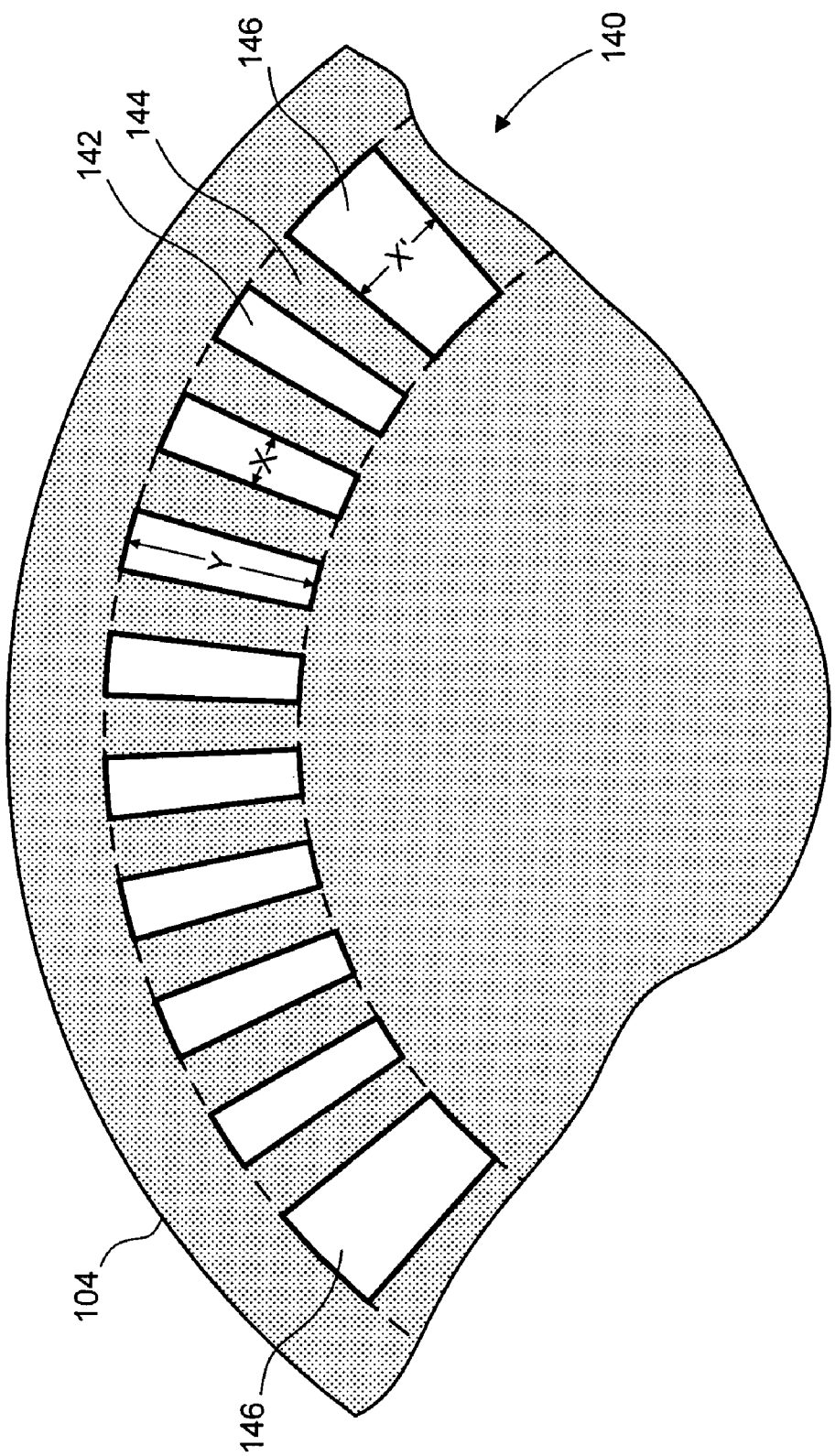
FIG. 2 depicts a partial schematic diagram of one embodiment of a code wheel.

Although a more detailed illustration of the code wheel 104 is provided in FIG. 2, a brief explanation is provided here as context for the operation of the reflective optical encoding system 100 shown in FIG. 1. In general, the code wheel 104 includes a track 140 of reflective sections 142 and non-reflective sections 144. An emitter 120 in the encoder 106 produces light that is incident on the code wheel track 140. As the code wheel 104 is rotated, for example by a motor shaft (not shown), the incident light is reflected by the reflective sections 142 of the track 140, but is not reflected by the non-reflective sections 144 of the track 140. Thus, the light is reflected by the track 140 in a modulated pattern (i.e., on-off-on-off . . . ). A detector 130 in the encoder 106 detects the modulated, reflected light signal and, in response, generates one or more periodic channel signals (e.g., $CH_A$ and $CH_B$). In one embodiment, these channel signals are then transmitted to the decoder 108, which generates a count signal and transmits the count signal to the microprocessor 110. The microprocessor 110 uses the count signal to evaluate the movement of, for example, the motor shaft or other moving part to which the code wheel 104 is coupled.

In one embodiment, the encoder 106 includes the emitter 120 and the detector 130. The emitter 120 includes a light source 122 such as a light-emitting diode (LED). For convenience, the light source 122 is described herein as an LED, although other light sources, or multiple light sources, may be implemented. In one embodiment, the LED 122 is driven by a driver signal, VLED, through a current-limiting resistor, $R_L$. The details of such driver circuits are well-known. Some embodiments of the emitter 120 also may include a lens 124 aligned with the LED 122 to direct the projected light in a particular path or pattern. For example, the lens 124 may focus the light onto the code wheel track 140.

In one embodiment, the detector 130 includes one or more photodetectors 132 such as photodiodes. The photodetectors may be implemented, for example, in an integrated circuit (IC). For convenience, the photodetectors 132 are described herein as photodiodes, although other types of photodetectors may be implemented. In one embodiment, the photodiodes 132 are uniquely configured to detect a specific pattern or wavelength of reflected light. In some embodiments, several photodiodes 132 may be used to detect modulated, reflected light signals from multiple tracks 140, including position tracks and index tracks. Also, the photodiodes 132 may be arranged in a pattern that corresponds to the radius and design of the code wheel 104. The various patterns of photodiodes 132 are referred to herein as photodetector arrays.

The signals produced by the photodiodes 132 are processed by signal processing circuitry 134 which generates the channel signals, $CH_A$ and $CH_B$. In one embodiment, the detector 130 also includes one or more comparators (not shown) to generate the channel signals. For example, analog signals from the photodiodes 132 may be converted by the comparators to transistor-transistor logic (TTL) compatible, digital output signals. In one embodiment, these output channel signals may indicate count and direction information for the modulated, reflected light signal. Additionally, the detector 130 may include a lens 136 to direct the reflected light signal toward the photodiodes 132.

Additional details of emitters, detectors, and optical encoders, generally, may be referenced in U.S. Pat. Nos. 4,451,731, 4,691,101, and 5,241,172, which are incorporated by reference herein.

FIG. 2 depicts a partial schematic diagram of one embodiment of a code wheel 104. In particular, FIG. 2 illustrates a portion of a circular code wheel 104 in the shape of a disc. In some embodiments, the code wheel 104 may be in the shape of a ring, rather than a disc. The illustrated code wheel 104 includes a track 140, which may be a circular track that is concentric with the code wheel 104. In one embodiment, the track 140 includes a continuous repeating pattern that goes all the way around the code wheel 104. The depicted pattern includes alternating reflective sections 142 and non-reflective sections 144, although other patterns may be implemented. These reflective sections 142 and non-reflective sections 144 are also referred to as position sections. In one embodiment, the reflective sections 142 are transparent sections of the code wheel 104. The non-reflective sections 144 are, for example, opaque sections in the code wheel 104 or, alternatively, are voids (e.g., holes) in the code wheel 104. In one embodiment, the surface areas corresponding to the reflective sections 142 are coated with a reflective material. In another embodiment, similar to the implementation shown in FIG. 1, the reflective sections 142 of the code wheel 104 may be transparent, with a reflective coating 102 on the opposite side of the code wheel 104. In this embodiment, the non-reflective sections 144 may be opaque so that they absorb the light from the LED 122.

In some embodiments, a transmissive coding element is implemented instead of a reflective coding element. A transmissive coding element such as a code wheel or code strip includes a track 140 of transmissive and non-transmissive sections, rather than reflective and non-reflective sections 142 and 144. In one embodiment, the transmissive coding element is substantially similar to the reflective coding element, except that the transmissive coding element does not include a reflective material 102. In this way, the transparent sections 142 transmit light through the code wheel 104 and the opaque sections 144 do not transmit light through the code wheel 104.

Also, it should be noted that, in some embodiments, the circular code wheel 104 could be replaced with a coding element that is not circular. For example, a linear coding element such as a code strip 180 may be used (see FIG. 6 and the accompanying description). Also, an imaging coding element 222 may be used (see FIG. 8 and the accompanying description) in place of a reflective or transmissive coding element 104.

As described above, rotation of the code wheel 104 and, hence, the track 140 results in modulation of the reflected light signal at the detector 130 to measure position changes of the code wheel 104. Other embodiments of the code wheel 104 may include other tracks such as additional position tracks or an index track, as are known in the art.

In addition to the illustrated position sections 142 and 144, the code wheel 104 also includes limit switch sections 146. In the depicted embodiment, the position track sections 142 and 144 have the same circumferential dimensions (also referred to as the width dimension, as indicated by the span "x"). In other words, the intermediate non-reflective track sections 144 have the same width dimension as the reflective track sections 142. The resolution of the code wheel 104 is a function of the width dimensions of the position track sections 142 and 144. In one embodiment, the width dimensions of the non-reflective track sections 144 are a function of the amount of area required to produce a detectable gap between consecutive, reflected light pulses.

In one embodiment, the limit switch sections 146 have a greater width dimension (as indicated by the span "x'") than the position tracks 142 and 144. In some embodiments, the limit switch sections 146 have a width that is an integral multiple of the width of the position track sections 142 and 144. For example, the limit switch sections 146 may have a width that is twice the width of a single position track sections 142 (i.e., the same as the combined width of a reflective track section 142 and a non-reflective track section 144). Other embodiments may implement different widths for the limit switch sections 146. Additionally, although the depicted code wheel 104 includes two limit switch sections 146 (one at each end of the group of position sections 142 and 144), other embodiments of the code wheel 104 may include another number of limit switch sections 146 such as a single limit switch section 146. A single limit switch section 146 may be used to limit movement of the code wheel 104 at a single end of the code wheel track 140. Alternatively, a single limit switch section 146 may be used in a circular code wheel track 140 (where the rest of the code wheel track 140 is used for position track sections 142 and 144) to limit movement of the code wheel 104 to approximately one revolution.

Moreover, the limit switch sections 146 are located within the same track 140 as the position sections 142 and 144. By including the limit switch sections 146 in the same track 140 as the position sections 142 and 144, the overall size of the code wheel 104 may be reduced compared to a conventional code wheel which includes two or more separate tracks for position and limit switch, or indexing, sections.

Figure 3:
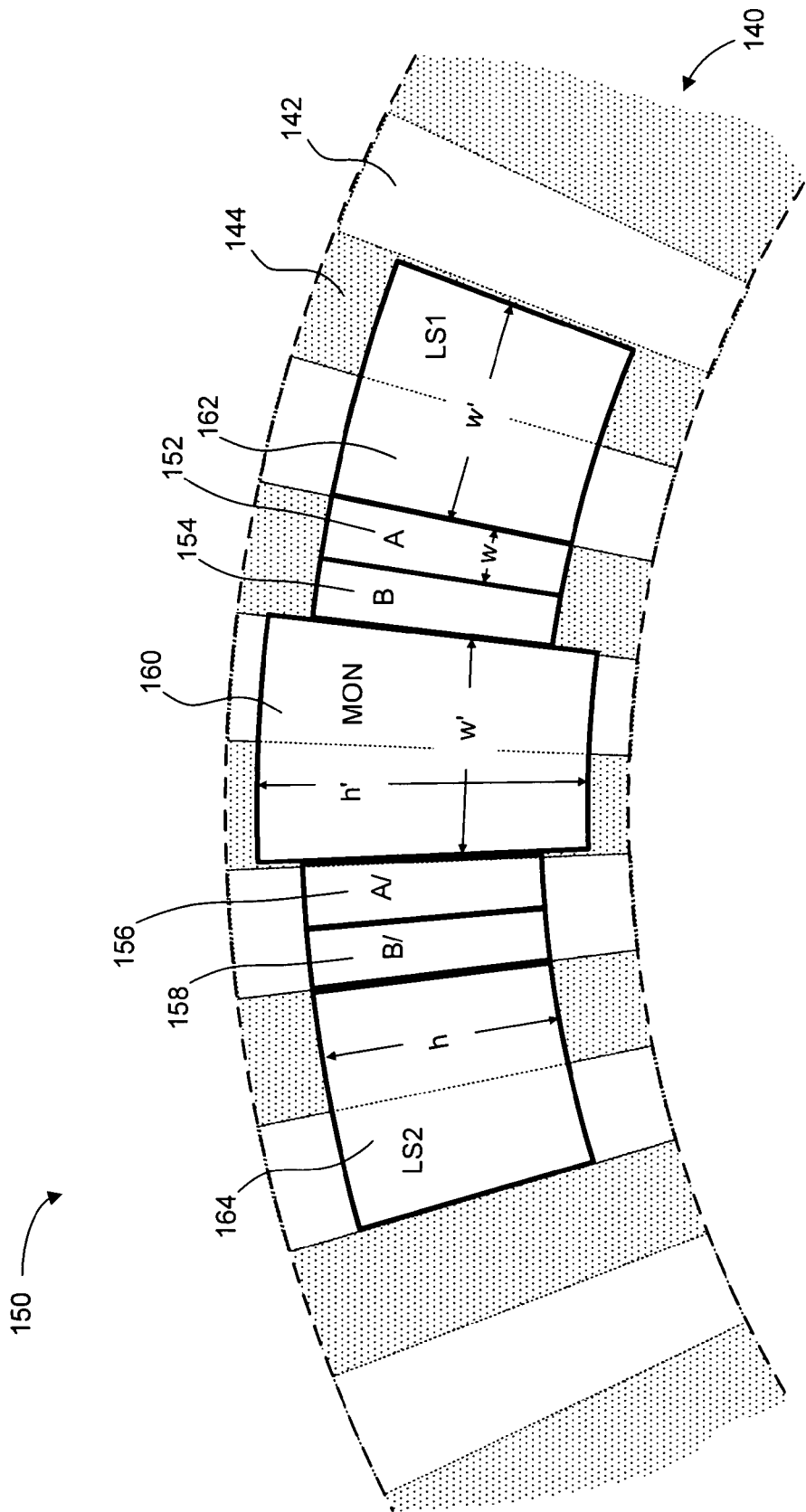
FIG. 3 depicts a schematic layout of one embodiment of a photodetector array relative to the code wheel track.
Figure 7:
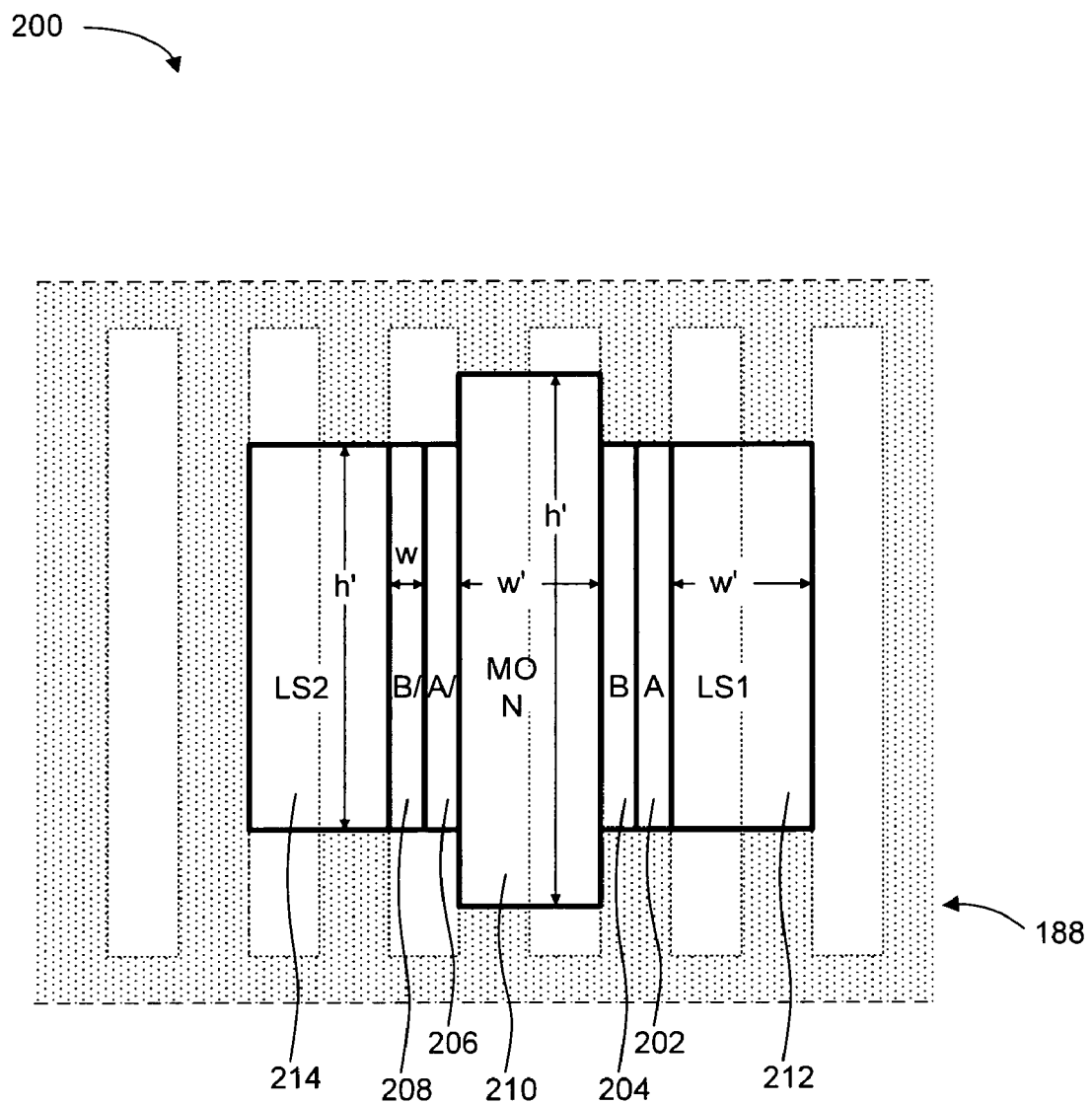
FIG. 7 depicts a schematic layout of one embodiment of a linear photodetector array relative to the code strip track.

FIG. 3 depicts a schematic layout of one embodiment of a photodetector array 150 relative to the code wheel track 140. The photodetector array 150 is also referred to as a photodiode array. A representation of the code wheel track 140 is overlaid with the photodiode array 150 to depict exemplary dimensions of the individual photodiode array elements with respect to the sections of the code wheel track 140. Although the photodiode array 150 corresponds to a circular code wheel track 140, other embodiments may implement a photodiode array 150 arranged to align with a linear code strip track. As an example, FIG. 7 shows a linear photodiode array 200.

The illustrated photodiode array 150 includes several individual photodiodes, including an A-signal photodiode 152 to generate an A signal, a B-signal photodiode 154 to generate a B signal, an A/-signal photodiode 156 to generate an A/ signal, and a B/-signal photodiode 158 to generate a B/ signal. For clarification, "A/" is read as "A bar" and "B/" is read as "B bar." This designation of the position photodiodes 152, 154, 156, and 158 and the corresponding electrical signals that are generated by the position photodiodes 152, 154, 156, and 158 is well-known in the art. The circumferential dimensions (also referred to as the width dimensions, indicated by the span "w") of the position photodiodes 152, 154, 156, and 158 are related to the width dimensions of the position track sections 142 and 144 of the corresponding code wheel track 140. In the embodiment of FIG. 3, each position photodiode 152, 154, 156, and 158 has a width that is one half the width of the reflective and non-reflective track sections 142 and 144 of the corresponding position track 140 (i.e., "w" equals "x/2").

The illustrated photodiode array 150 also includes a monitor photodiode 160 between the B-signal photodiode 154 and the A/-signal photodiode 156. The monitor photodiode 160 generates a monitor output (MON) signal. In some embodiments, the monitor photodiode 160 has a width dimension (indicated by the span "w'") that is an integral multiple of the width of a single position photodiode 152. For example, the monitor photodiode 160 may have a width that is twice the width of the position track sections 142 and 144 (i.e., the same as the combined width of a reflective track section 142 and a non-reflective track section 144), in which case the width of the monitor photodiode 160 would be four times the width of each of the position photodiodes 152, 154, 156, and 158 (i.e., "w'" equals "4w"). In some embodiments, the monitor output signal may be used to establish a limit switch threshold, as described in more detail below. The use of the monitor photodiode 160 to generate a limit switch threshold may impact the height dimension (indicated by the span "h'") of the monitor photodiode 160, as described below.

The illustrated photodiode array 150 also includes two limit switch photodiodes 162 and 164. A first limit switch photodiode 162 is located at one end of the photodiode array 150, and generates a limit switch output signal (LS1) indicative of a boundary position of the code wheel 104 and, hence, a moving part of a device coupled to the code wheel 104. The second limit switch photodiode 164 is located at an opposite end of the photodiode array 150, and generates a second limit switch output signal (LS2) indicative of an opposite boundary position of the code wheel 104 and coupled to the moving part of the device. In some embodiments, the width dimensions (as indicated by the span "w'") of the limit switch photodiodes 162 and 164 are the same as the width dimension of the monitor photodiode 160. As described above, the width dimension of the limit switch photodiodes 162 and 164, and monitor photodiode are integral multiples of the width of a pair of position track sections 142 and 144 (i.e., a multiple of the combined width of a reflective track section 142 and a non-reflective track section 144). In this way, the limit switch output signals from the limit switch photodiodes 162 and 164 do not change in value when the code wheel track 140 moves relative to the photodiode array 150.

The height dimensions (indicated by the "h") of the limit switch photodiodes 162 and 164 are shown the same as the height dimensions of the position photodiodes 152, 154, 156, and 158. However, other embodiments may implement other combinations of height dimensions. In one embodiment, the height dimensions of the limit switch photodiodes 162 and 164 are implemented relative to the height dimension of the monitor photodiode 160 so that the monitor output signal is fixed between a the maximum and minimum of the signal range for each of the limit switch photodiodes 162 and 164. In this way, the monitor output signal may be used as a limit switch threshold to digitize the limit switch output signals. In one embodiment, the height dimension of the monitor photodiode 160 is one and a half times the height dimensions of the limit switch photodiodes 162 and 164 (i.e., "h'" equals "1.5h"). However, other embodiments may implement other relative height and width dimensions.

It should be noted that although the illustrated photodiode array only includes one of each type of photodiode, other embodiments may include more than one of some or all of the photodiodes. Implementing several photodiodes of a single type may facilitate signal averaging to reduce signal errors, increasing photocurrent from the combined photodiodes, or otherwise affecting performance of the photodiode array 150. For example, implementing several photodiodes of a single type may make the photodiode array 150 more robust, for example, so that it is less affected by dust or other contamination.

Figure 4:
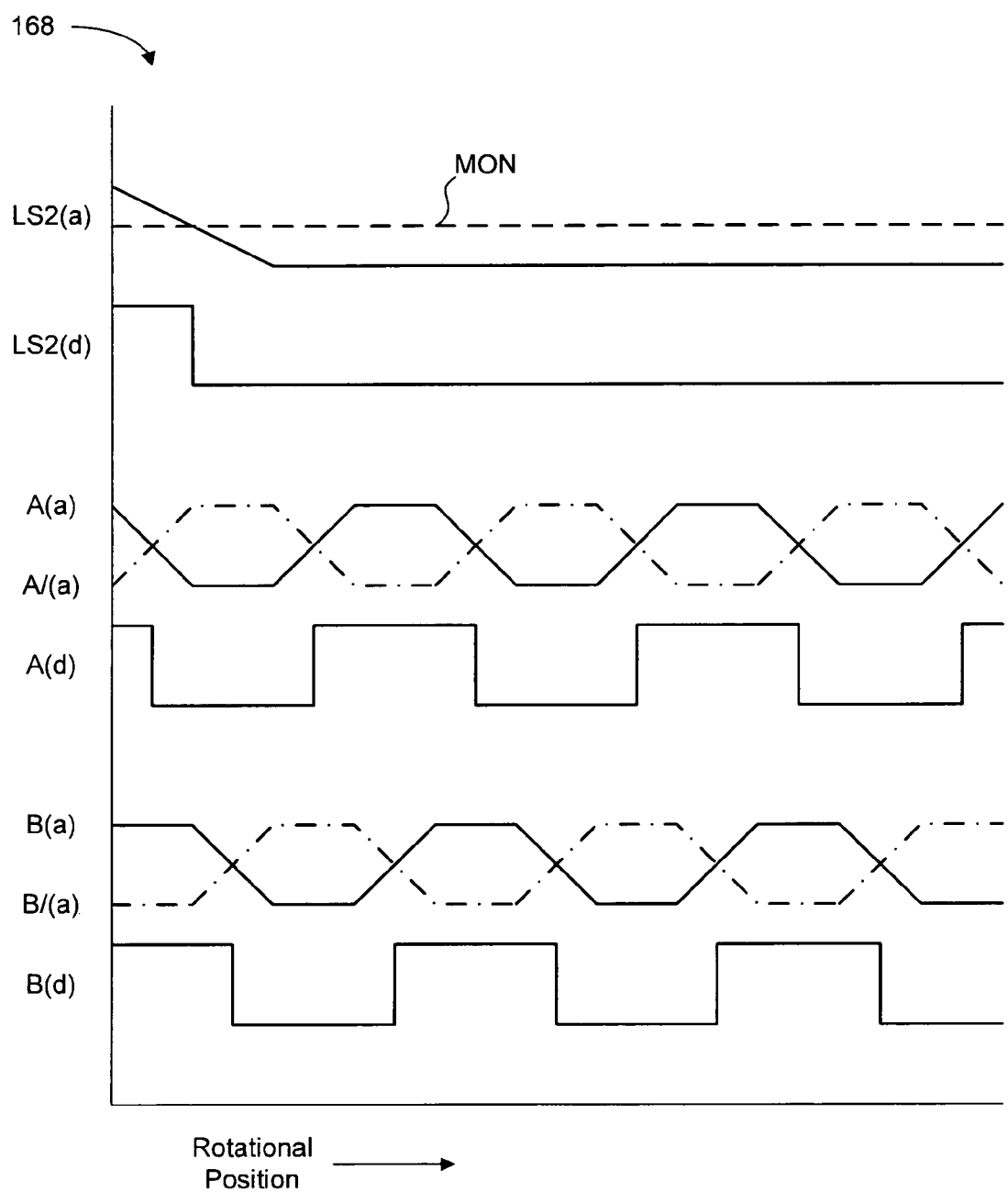
FIG. 4 depicts a wave diagram of analog signals generated by the photodetector array of FIG. 3, and corresponding digital signals, as the track moves relative to the photodetector array.

FIG. 4 depicts a wave diagram 168 of analog signals generated by the photodetector array 150 of FIG. 3, and corresponding digital signals, as the track 140 moves relative to the photodetector array 150. In particular, the wave diagram 168 shows exemplary analog and corresponding digital signals produced by the photodiode array 150 as the track 140 rotates.

For convenience, the following description uses a convention to distinguish between analog and digital signals associated with each photodiode in the photodiode array 150: an "(a)" denotes the analog signal, and a "(d)" denotes the digital signal. In the depicted embodiment, the analog limit switch signal LS2(a) is shown decreasing from a high level to a low level. The high level occurs when the limit switch photodiode 164 is aligned with the corresponding limit switch section 146 of the track 140. The limit switch signal LS2(a) decreases as the code wheel 104 rotates and the limit switch photodiode 164 aligns with the position track sections 142 and 144. In one embodiment, the monitor output signal MON is used to establish a threshold to generate a corresponding digital limit switch signal LS2(d). In one embodiment, when the limit switch signal LS2(d) is high, the microprocessor 110 may prevent the monitored device such as a motor shaft from turning further in a specified direction.

As the code wheel 104 rotates, for example, in a counter-clockwise direction, the analog position signals A(a), B(a), A/(a), and B/(a) shift between high and low levels, depending on the rotation of the position track sections 142 and 144 relative to the position photodiodes 152, 154, 156, and 158. In one embodiment, the A/(a) and B/(a) signals are used with the A(a) and B(a) signals, respectively, to generate corresponding digital position signals A(d) and B(d). For example, the A(d) signal is set to a logical high state when the A(a) signal is greater than the A/(a) signal. A comparator may be used to compare the A(a) and A/(a) signals. The generation of these analog and digital position signals is well-known in the art.

Figure 5:
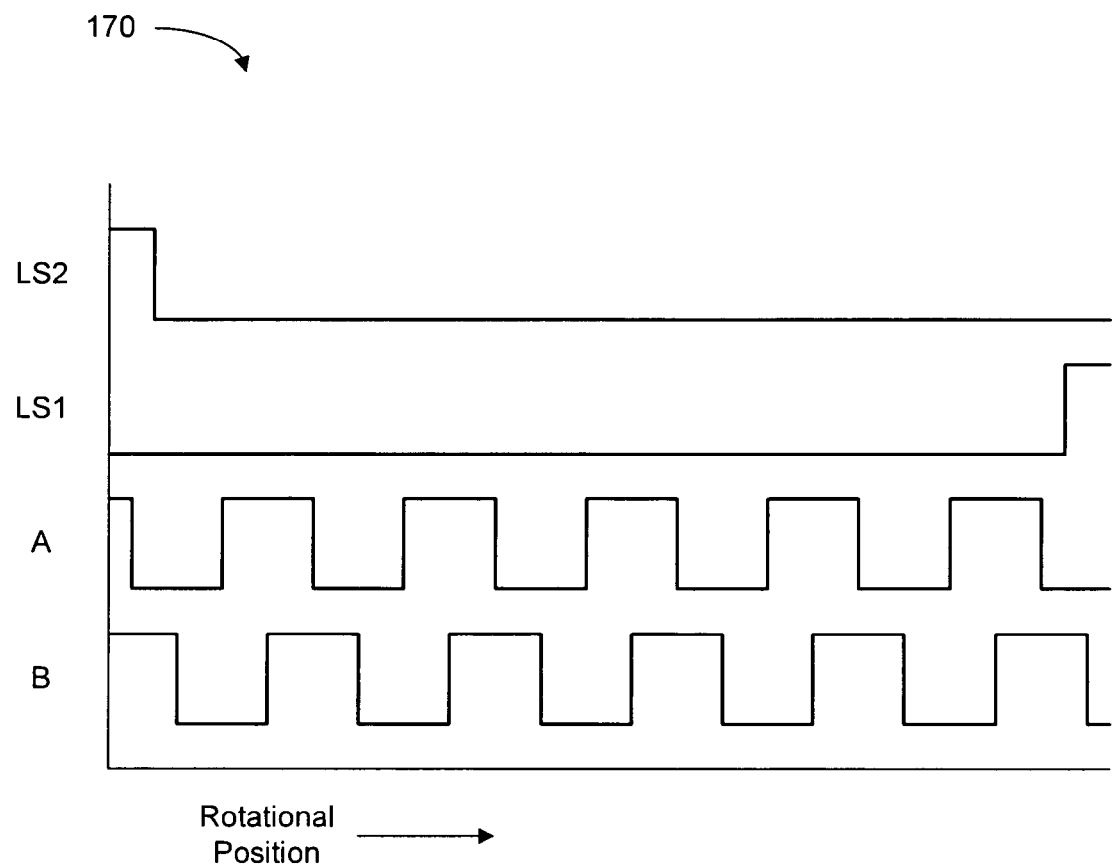
FIG. 5 depicts exemplary digital signals associated with movement of a moving part of a device from one boundary position to an opposite boundary position.

FIG. 5 depicts exemplary digital signals associated with movement of a moving part of a device from one boundary position to an opposite boundary position. In particular, as the device such as a motor shaft rotates, the digital position signals A and B (other implementation also may use A/ and B/) rise and fall according to the rotation of the code wheel 104 and the resolution of the code wheel track 140. Once the code wheel 104 rotates to a boundary position, the limit switch signal LS1 goes high to indicate that the limit switch photodiode LS1 is aligned with the corresponding limit switch section 146 at one end of the track 140. In response to the limit switch signal LS1 going high, the microprocessor 110 controls the movement of the device to stop rotation in that direction, and may begin rotation in the opposite direction.

Once the code wheel 104 rotates back to the starting position (i.e., to the opposite boundary position), the limit switch signal LS2 goes high to indicate that the limit switch photodiode LS2 is aligned with the corresponding limit switch section 146 at the opposite end of the track 140. In response to the limit switch signal LS2 going high, the microprocessor 110 controls the movement of the device to stop rotation in that direction, and may begin rotation in the opposite direction. Additionally, the microprocessor 110 may control the device to stop at any intermediate rotational position between the boundary limit switch positions.

Figure 6:
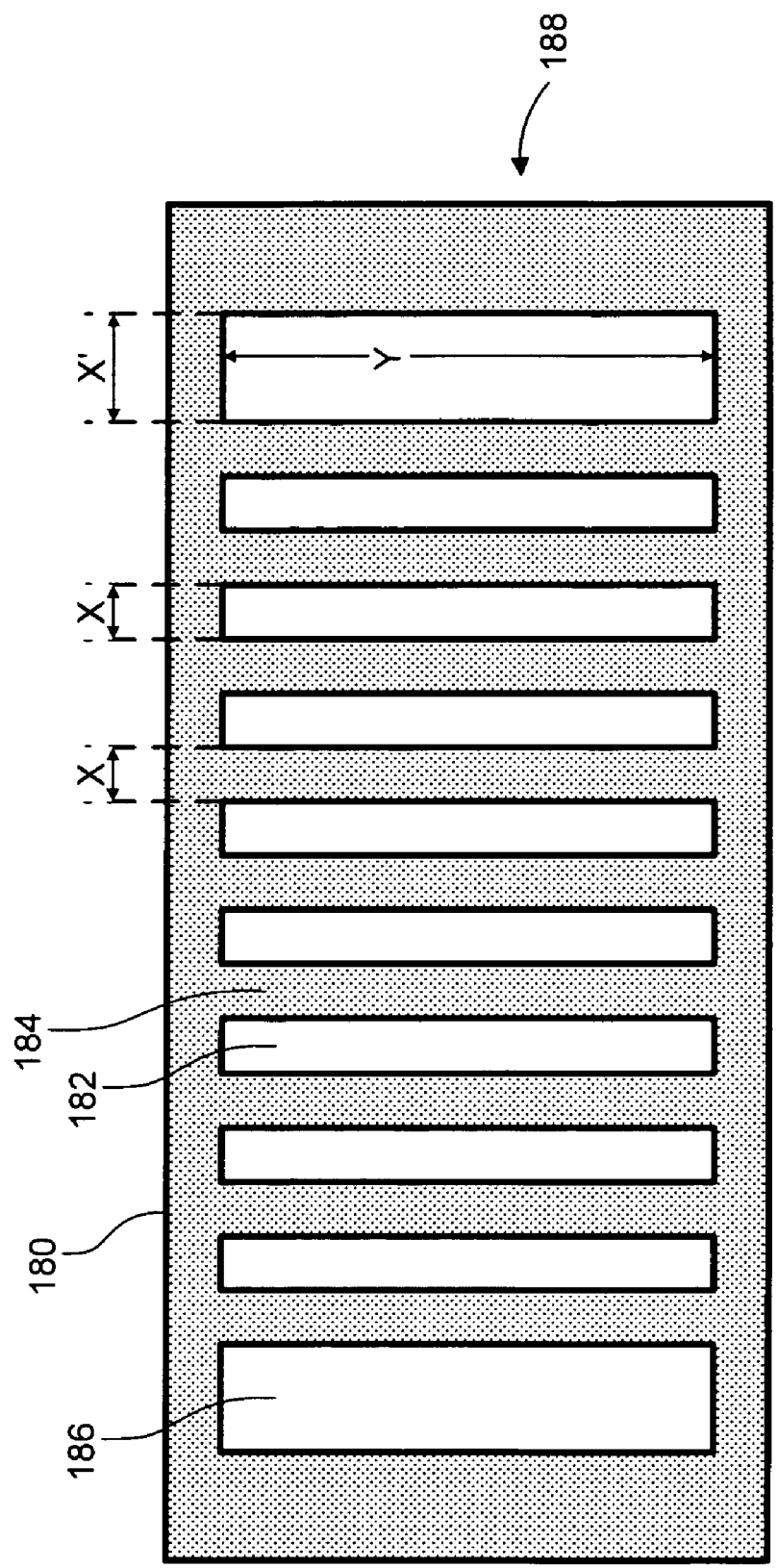
FIG. 6 depicts a schematic diagram of one embodiment of a code strip.

FIG. 6 depicts a schematic diagram of one embodiment of a code strip 180. The functionality of the code strip 180 is substantially similar to the functionality of the code wheel 104 described above, except that the code strip 180 may be used to monitor and limit movement in a substantially linear direction. The code strip 180 includes reflective sections 182 and non-reflective sections 184, which are position sections. In one embodiment, each of the position track sections 182 and 184 has approximately the same width dimension (indicated by the "x"). Similarly, the position track sections 182 and 184 have approximately the same height dimension (indicated by the "y"). In another embodiment, the position track sections 182 and 184 may be transmissive and non-transmissive sections, rather than reflective and non-reflective sections.

The illustrated code strip 180 also includes limit switch sections 186 at each end of the group of position track sections 182 and 184. Each limit switch section 186 has a width dimension (as indicated by the "x'") and a height dimension (as indicated by the "y"). In one embodiment, the height dimension is the same for the limit switch sections 182 and the position track sections 182 and 184, and the width dimension of the limit switch sections 186 are twice the width of the position track sections 182 and 184 (i.e., "x'" equals "2x"). Other embodiments may implement limit switch sections 186 and position track sections 182 and 184 with different width and height dimensions. Together, the limit switch sections 186 and position track sections 182 and 184 are in a single code strip track 188.

FIG. 7 depicts a schematic layout of one embodiment of a linear photodetector array 200 relative to the code strip track 188. The linear photodetector array 200 is also referred to as a linear photodiode array. The functionality of the linear photodiode array 200 is substantially similar to the functionality of the photodiode array 150 described above, except that the photodiodes of the linear photodiode array 200 are oriented in a linear, rather than a radial, configuration.

The illustrated linear photodiode array 200 includes several individual photodiodes, including an A-signal photodiode 202 to generate an A signal, a B-signal photodiode 204 to generate a B signal, an A/-signal photodiode 206 to generate an A/ signal, and a B/-signal photodiode 208 to generate a B/signal. The linear photodiode array 200 also includes a monitor photodiode 210, between the B-signal photodiode 204 and the A/-signal photodiode 206, to generate a monitor output (MON) signal. The linear photodiode array 200 also includes two limit switch photodiodes 212 and 214. A first limit switch photodiode 212 is located at one end of the linear photodiode array 200, and generates a limit switch output signal (LS1) indicative of a boundary position of the code strip 180. The second limit switch photodiode 214 is located at an opposite end of the linear photodiode array 200, and generates a second limit switch output signal (LS2) indicative of an opposite boundary position of the code strip 180. The dimensions of the various photodiodes in the linear photodiode array 200 may have similar relationships to each other and to the linear code strip track 180 as the photodiode array 150 described above.

Figure 8:
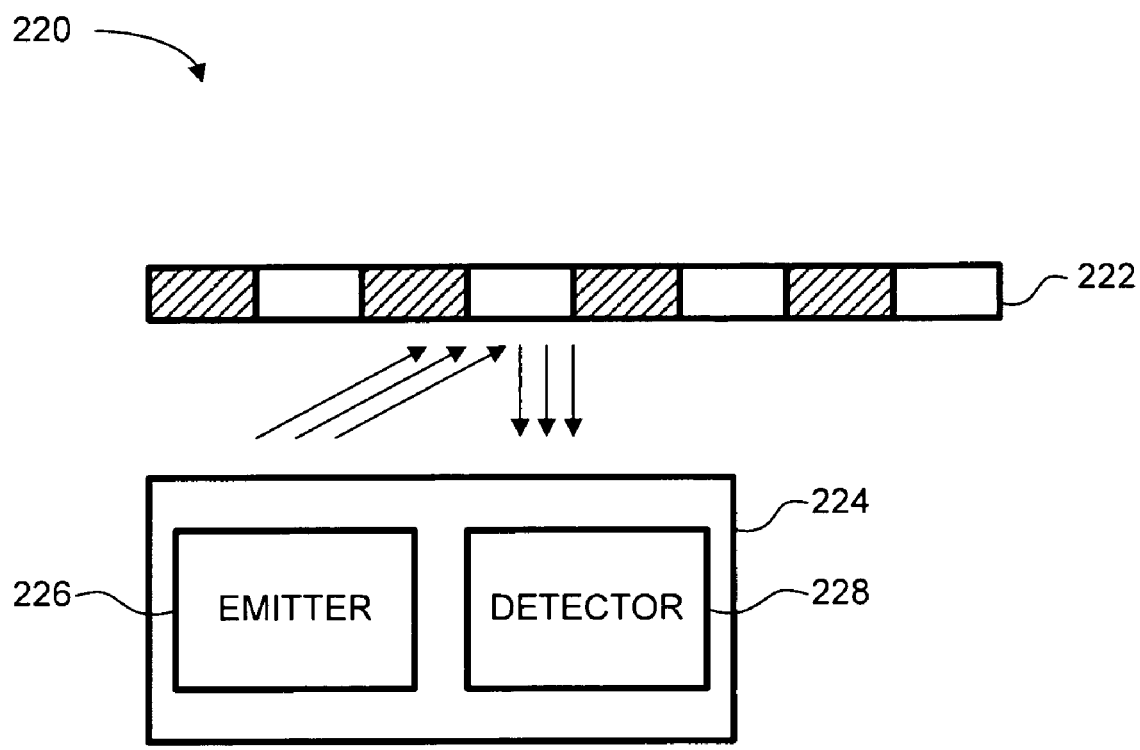
FIG. 8 depicts a schematic diagram of one embodiment of an imaging encoding system.

FIG. 8 depicts a schematic diagram of one embodiment of an imaging encoding system 220. The illustrated imaging encoding system 220 includes an imaging coding element 222, for example, an imaging code strip or code wheel. The functionality of the imaging code wheel 222 is substantially similar to the functionality of the reflective code wheel 104, described above, except that the imaging code wheel 222 does not necessarily have a reflective material 102 applied to the opposite side of the code wheel 222.

In some aspects, the imaging encoder 224 operates similarly to the encoder 106 described above. The imaging encoder 224 includes an emitter 226 and a detector 228. However, in contrast to the reflective optical encoding system 100 of FIG. 1, the imaging encoding system 220 differentiates between different track sections on the imaging code wheel 222 based on how the light bounces back from the non-absorptive pattern on the code wheel 222. In particular, the detector 228 detects the diffuse portion of the light, rather than a reflected portion. Additional details of at least one embodiment of an imaging encoding system 220 are described in U.S. Pat. No. 7,102,123, which is incorporated by reference herein.

Figure 9:
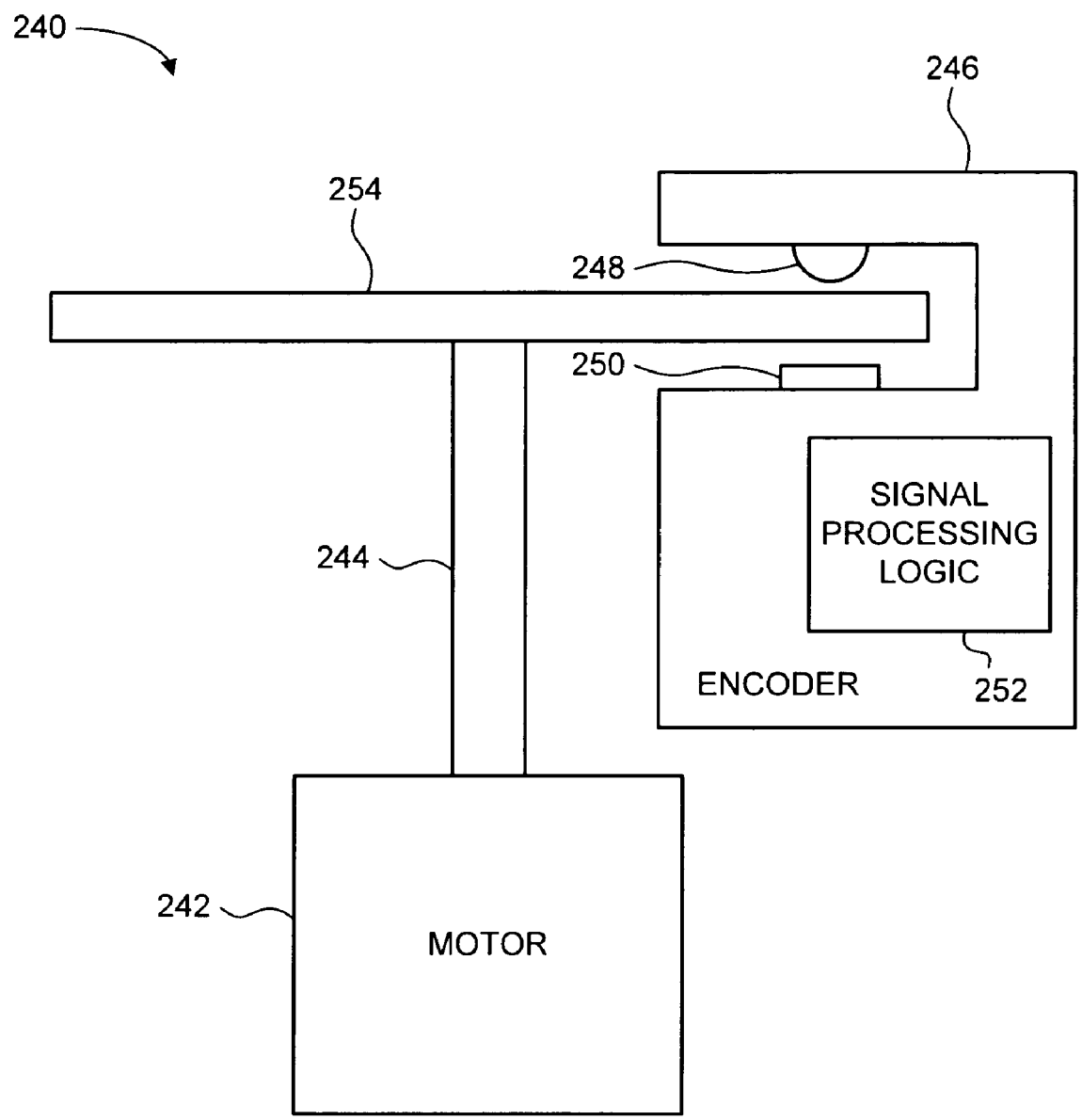
FIG. 9 depicts a schematic diagram of one embodiment of a transmissive optical encoding system.

FIG. 9 depicts a schematic diagram of one embodiment of a transmissive optical encoding system 240. The illustrated transmissive optical encoding system includes a motor 242, a shaft 244, a transmissive code wheel 254, and an encoder module 246. As described above, the code wheel 104 includes at least one track 140 for use in determining, for example, an absolute rotational position of the motor shaft 242. In the depicted embodiment, the encoder module 246 includes a light source 248, a photodetector module 250, and signal processing logic 252. The functionality of the illustrated encoding components of the transmissive encoding system 240 are substantially similar to the corresponding components shown in FIG. 1 and described above. Other components of the transmissive optical encoding system 240 such as the components described in relation to the encoding system 100 of FIG. 1 are omitted for clarity. In contrast to the encoding system 100 of FIG. 1, the transmissive optical encoding system 240 includes a transmissive code wheel 254 instead of a reflective code wheel 104. However, the functionality of the transmissive optical encoding system 240 is substantially similar to the functionality described above. Hence, additional details of the transmissive optical encoding system 240 are not provided.

Figure 10:
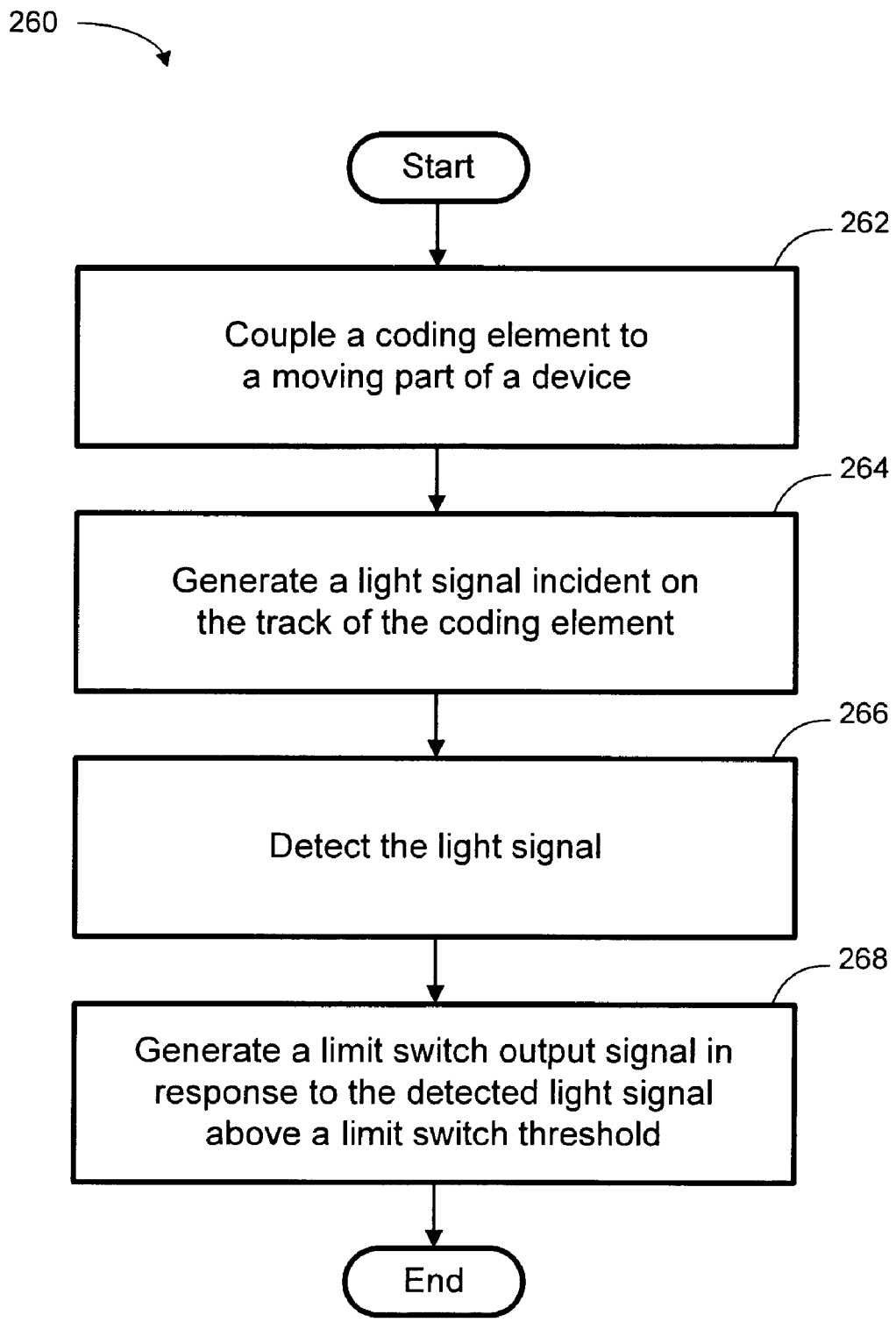
FIG. 10 depicts a process flow diagram of one embodiment of a method for controlling a range of motion for a device.

FIG. 10 depicts a process flow diagram of one embodiment of a method 260 for controlling a range of motion for a device. An exemplary device that may be controlled is a motor shaft 244, although other devices which exhibit rotational or linear motion may be controlled.

At block 262, a coding element such as a code wheel 104 or a code strip 180 is coupled to a moving part of a device such as a motor shaft 244. At block 264, a light signal is generated and incident on the track 140 of the coding element. In one embodiment, the light signal originates from one or more LEDs 122. At block 266, the light signal is detected after it has been applied to the coding element. As used in this context, the term "applied" means reflected by or transmitted through the coding element, depending on whether the coding element is a reflective coding element or a transmissive coding element. At block 268, a limit switch output signal (e.g., LS1 or LS2) is generated in response to the detected light signal above a limit switch threshold (e.g., MON). The depicted method 260 then ends.

Embodiments of a code wheel with one or more limit switch implementations as described herein may be used in various types of systems. For example, embodiments may be implemented in focusing systems for cameras and projectors. Other embodiments may be implemented in other systems which benefit from control of a device within a limited range of rotational motion.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An optical encoder comprising:
a coding element having a track with a track pattern, the track pattern comprising a plurality of optically distinguishable sections, wherein the plurality of optically distinguishable sections comprises a limit switch section;
an emitter configured to generate a light signal incident on the track of the coding element; and
a detector comprising a limit switch photodetector positioned to detect the light signal from the emitter, the detector configured to generate a limit switch output signal in response to the detected light signal above a limit switch threshold at the limit switch photodetector.

2. The optical encoder of claim 1 wherein the coding element comprises a reflective coding element, and the plurality of optically distinguishable sections comprise a plurality of reflective sections and a plurality of non-reflective sections.

3. The optical encoder of claim 1 wherein the coding element comprises a transmissive coding element, and the plurality of optically distinguishable sections comprise a plurality of transmissive sections and a plurality of non-transmissive sections.

4. The optical encoder of claim 1 wherein the coding element comprises a code wheel.

5. The optical encoder of claim 1 wherein the coding element comprises a code strip.

6. The optical encoder of claim 1 wherein the detector further comprises a monitor photodetector positioned to detect the light signal from the emitter, the detector configured to generate a monitor output signal in response to the detected light signal at the monitor photodetector, wherein the limit switch threshold is based on the monitor output signal.

7. The optical encoder of claim 1 wherein the limit switch section is located at one end of the plurality of optically distinguishable sections, the plurality of optically distinguishable sections comprising a second limit switch section located at an opposite end of the plurality of optically distinguishable sections.

8. The optical encoder of claim 1 wherein the plurality of optically distinguishable sections comprises a plurality of position sections, and wherein the plurality of position sections and the limit switch section are in the same track of the coding element.

9. A system to control a range of motion for a device, the system comprising:
an encoder comprising a coding element coupled to a moving part of the device, the coding element comprising a track with a track pattern of a plurality of optically distinguishable sections, wherein the plurality of optically distinguishable sections comprises a limit switch section, the encoder configured to generate a periodic channel signal indicative of movement of the moving part of the device and a limit switch output signal indicative of a boundary position of the moving part of the device;
a decoder coupled to the encoder, the decoder to generate a count signal corresponding to the periodic channel signal and to generate a limit signal corresponding to the limit switch output signal; and
a microprocessor coupled to the decoder, the microprocessor to control the movement of the moving part and to alter the movement of the moving part in response to the limit signal from the decoder.

10. The system of claim 9 wherein the moving part of the device comprises a focusing element.

11. The system of claim 10 wherein the device comprises a camera.

12. The system of claim 10 wherein the device comprises a projector.

13. The system of claim 9 wherein the moving part comprises a motor shaft, and the coding element comprises a code wheel coupled to the motor shaft.

14. The system of claim 9, wherein the coding element comprises a code strip.

15. The system of claim 9, wherein the encoder comprises an optical imaging encoder.

16. The system of claim 9 wherein the encoder comprises:

a light source to generate a light signal incident on the track of the coding element, wherein the light source comprises a light emitting diode (LED);

a photodetector array comprising a plurality of photodiodes to detect the light signal from the track of the coding element, wherein the plurality of photodiodes comprises:

an A-signal photodiode to generate an analog A signal;

a B-signal photodiode adjacent to the A-signal photodiode, the B-signal photodiode to generate an analog B signal;

an A/-signal photodiode to generate an analog A/ signal;

a B/-signal photodiode adjacent to the A/-signal photodiode, the B/-signal photodiode to generate an analog B/ signal;

a monitor photodiode between the B-signal photodiode and the A/-signal photodiode, the monitor photodiode to generate a monitor signal;

a first limit switch photodiode at an end of the photodetector array, the first limit switch photodiode to generate the limit switch output signal indicative of the boundary position of the moving part of the device; and a second limit switch photodiode at an opposite end of the photodetector array, the second limit switch photodiode to generate a second limit switch output signal indicative of an opposite boundary position of the moving part of the device; and signal processing circuitry to process the analog signals from the photodiodes of the photodetector array to generate digital A and B signals, and to transmit the digital signals to the decoder.

17. A method for controlling a range of motion for a device, the method comprising:

coupling a coding element to a moving part of the device, wherein the coding element comprises a track with a track pattern of a plurality of optically distinguishable sections, wherein the plurality of optically distinguishable sections comprises a limit switch section;

generating a light signal incident on the track of the coding element;

detecting the light signal;

generating a limit switch output signal in response to the detected light signal above a limit switch threshold; and stopping movement of the moving part in response to the limit switch output signal.

18. The method of claim 17 further comprising:

generating a monitor output signal in response to the detected light; and establishing the limit switch threshold based on the monitor output signal.

19. The method of claim 17 wherein detecting the light signal from the emitter comprises detecting the light signal through a transmissive section of the track, wherein the plurality of optically distinguishable sections comprises a plurality of transmissive sections and a plurality of non-transmissive sections.

20. The method of claim 17 wherein detecting the light signal from the emitter comprises detecting the light signal from a reflective section of the track, wherein the plurality of optically distinguishable sections comprises a plurality of reflective sections and a plurality of non-reflective sections.

* * * * *